US012563669B2

(12) United States Patent
Arai et al.

(10) Patent No.: US 12,563,669 B2
(45) Date of Patent: Feb. 24, 2026

(54) METHOD FOR PRODUCING FLEXIBLE PRINTED WIRING BOARD

(71) Applicant: FUJIKURA PRINTED CIRCUITS LTD., Tokyo (JP)

(72) Inventors: Daisuke Arai, Chiba (JP); Toshiya Iwamura, Akita (JP)

(73) Assignee: FUJIKURA PRINTED CIRCUITS LTD., Tokyo (JP)

( * ) Notice: Subject to any disclaimer, the term of this patent is extended or adjusted under 35 U.S.C. 154(b) by 321 days.

(21) Appl. No.: 18/566,430

(22) PCT Filed: Apr. 22, 2022

(86) PCT No.: PCT/JP2022/018563
§ 371 (c)(1),
(2) Date: Dec. 1, 2023

(87) PCT Pub. No.: WO2022/254997
PCT Pub. Date: Dec. 8, 2022

(65) Prior Publication Data
US 2024/0365469 A1 Oct. 31, 2024

(30) Foreign Application Priority Data
Jun. 3, 2021 (JP) ................................. 2021-093839

(51) Int. Cl.
*H05K 1/11* (2006.01)
*G03F 1/50* (2012.01)
(Continued)

(52) U.S. Cl.
CPC ............... *H05K 1/118* (2013.01); *G03F 1/50* (2013.01); *G03F 7/2016* (2013.01);
(Continued)

(58) Field of Classification Search
CPC .... H05K 1/118; H05K 1/0281; H05K 3/0082; H05K 3/064; G03F 1/50; G03F 7/2016; G03F 7/70475
See application file for complete search history.

(56) References Cited

U.S. PATENT DOCUMENTS 6,559,389 B1 * 5/2003 Kornrumpf ............ H05K 1/118
29/829
9,077,168 B2 * 7/2015 Lin ........................ H02G 15/08
(Continued)

FOREIGN PATENT DOCUMENTS

JP        H05-136020  A        6/1993
JP        2001-308004  A       11/2001
(Continued)

OTHER PUBLICATIONS

International Search Report issued in corresponding International Application No. PCT/JP2022/018563 mailed Jul. 19, 2022 (5 pages).

*Primary Examiner* — Thanh Tam T Le
(74) *Attorney, Agent, or Firm* — Osha Bergman Watanabe & Burton LLP

(57) ABSTRACT

A method for producing a flexible printed wiring board using a photoresist includes placing the photoresist, including a first region and a second region, on a substrate, placing a first photomask including a first light-transmitting portion such that the first light-transmitting portion faces the first region to expose the photoresist through the first light-transmitting portion, and placing a second photomask including a second light-transmitting portion such that the second light-transmitting portion faces the second region to expose the photoresist through the second light-transmitting portion. The first region is adjacent to the second region such that an edge portion of the first region overlaps an edge portion of the second region. The first light-transmitting
(Continued)

portion has a linear shape including a first tip having a tapered shape.

4 Claims, 11 Drawing Sheets

(51) Int. Cl.
*G03F 7/00* (2006.01)
*G03F 7/20* (2006.01)
*H05K 1/02* (2006.01)
*H05K 3/00* (2006.01)
*H05K 3/06* (2006.01)

(52) U.S. Cl.
CPC ....... *G03F 7/70475* (2013.01); *H05K 1/0281* (2013.01); *H05K 3/0082* (2013.01); *H05K 3/064* (2013.01)

(56) References Cited

U.S. PATENT DOCUMENTS

| | | | | |
|---|---|---|---|---|
| 10,085,354 B2 * | 9/2018 | Iizaka | .................... | H05K 1/147 |
| 10,129,983 B2 * | 11/2018 | Uchida | ................. | H05K 1/189 |
| 10,251,262 B2 * | 4/2019 | Ogura | ...................... | H05K 1/02 |
| 11,277,919 B2 * | 3/2022 | Araki | ...................... | H05K 3/28 |
| 11,363,712 B2 * | 6/2022 | Kim | ........................ | H05K 1/118 |
| 11,469,288 B2 * | 10/2022 | Moon | ................. | H10K 59/126 |
| 11,527,470 B2 * | 12/2022 | Lee | ......................... | H05K 3/361 |
| 11,744,008 B2 * | 8/2023 | Misawa | ................. | H05K 1/115 |
| | | | | 174/66 |
| 11,812,559 B2 * | 11/2023 | Souriau | ............... | H05K 3/4007 |
| 12,236,028 B2 * | 2/2025 | Wang | .................... | H05K 3/361 |
| 12,355,169 B2 * | 7/2025 | Komoto | ................ | H01R 12/59 |

FOREIGN PATENT DOCUMENTS

| | | |
|---|---|---|
| JP | 2005-286207 A | 10/2005 |
| JP | 2011-044465 A | 3/2011 |
| JP | 2011-205042 A | 10/2011 |
| JP | 2016-082145 A | 5/2016 |
| JP | 2018-092966 A | 6/2018 |
| WO | 03/042759 A2 | 5/2003 |

* cited by examiner

<u>Fig. 1</u>
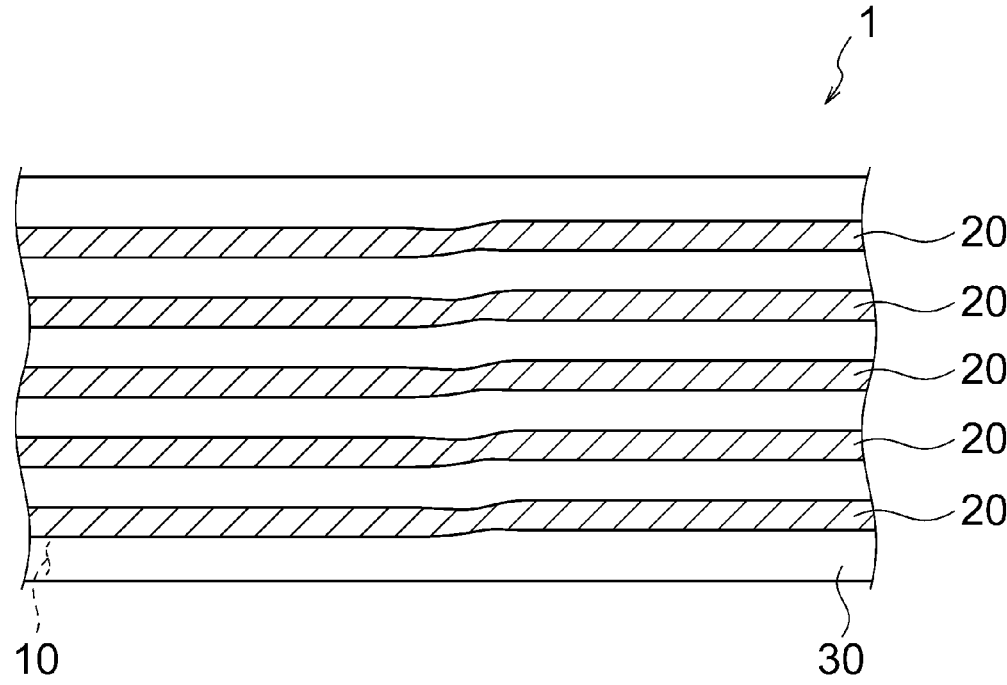
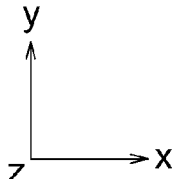

Fig. 2

<u>Fig. 3</u>
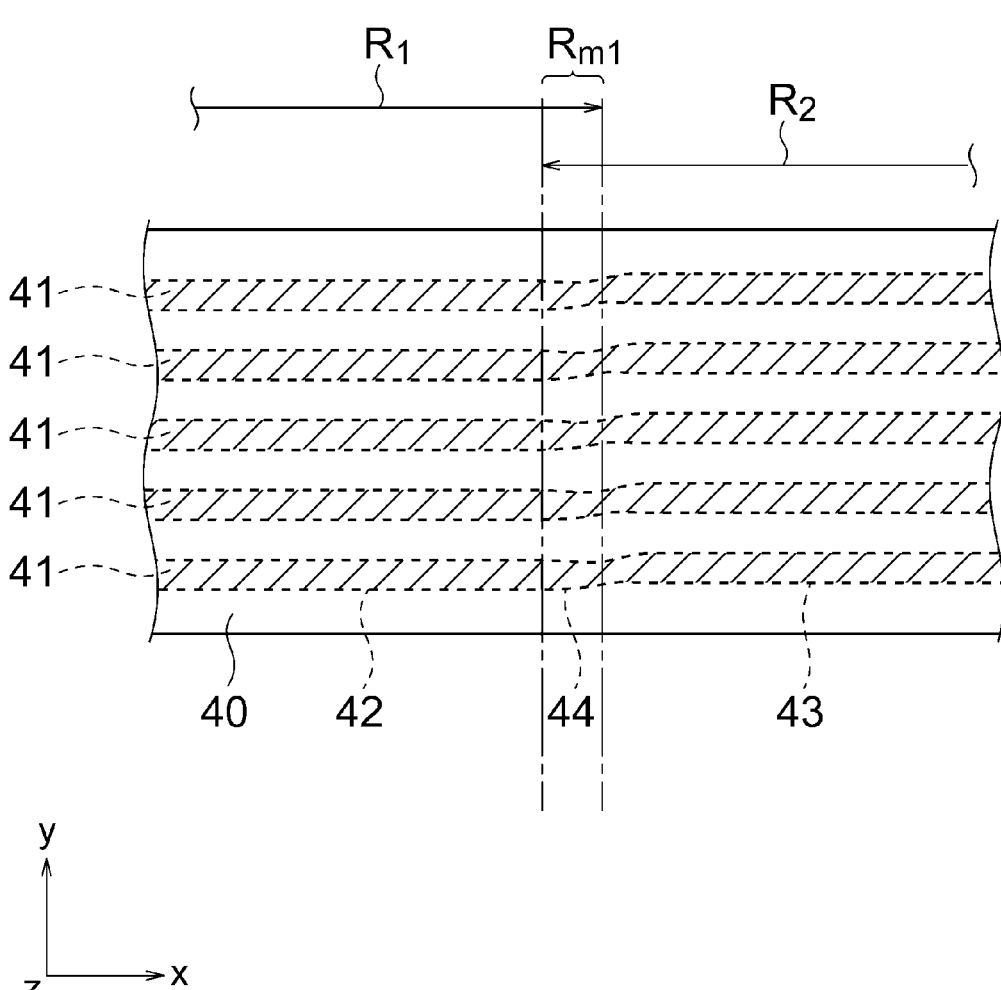

<u>Fig. 5</u>
50
52a     53     54
56
55
P₅
S₂
P₄
TR₂
P₆
P₂
S₁
P₁
TR₁
P₃
RE     51     52
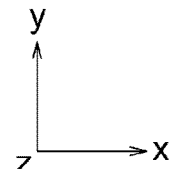
y
↑
→x
z

Fig. 6

METHOD FOR PRODUCING FLEXIBLE PRINTED WIRING BOARD

CROSS-REFERENCE TO RELATED APPLICATIONS

The present application claims priority to Japanese Patent Application No. 2021-093839, filed Jun. 3, 2021. The contents of this application are incorporated herein by reference in their entirety.

BACKGROUND

Technical Field

The present invention relates to a method for producing a flexible printed wiring board.

Description of the Related Art

A method for producing a long flexible wire circuit substrate includes steps of forming a thin metal film on a surface of an insulating layer, forming a photoresist on the surface of the thin metal film, exposing the photoresist over and over while shifting a photomask in the longitudinal direction with respect to the photoresist (e.g., see Patent Document 1).

The photomask comprises a light-transmitting portion having a shape corresponding to a wiring, the light-transmitting portion is composed of a plurality of light-transmitting regions of a rectangular shape extending linearly. In the exposure step, the photomask is disposed such that a rear end of the light-transmitting region of the photomask at the time of the previous exposure overlaps a front end of the light-transmitting region of the photomask at the time of the subsequent exposure.

PATENT DOCUMENT

PATENT DOCUMENT 1: JP2018-092966A

In the above-described exposure step, it is difficult to completely match the front end of the light-transmitting region of the photomask at the time of the subsequent exposure with respect to the rear end of the light-transmitting region of the photomask at the time of the previous exposure, and the front end sticks out of the rear end of the light-transmitting region. Therefore, the angular portions protruding in the width direction at the connection portion of the wiring are formed due to the front end sticked out of the rear end, then the steps with a change in rapid line width occurs in the side portion of the wiring (e.g., see Patent Document 1 (FIGS. 2-4)). The wiring may be damaged from the steps as a starting point, because stresses tend to concentrate on this steps when the flexible wiring circuitry substrate is bent.

SUMMARY

One or more embodiments provide a method of producing a flexible printed wiring board that does not occur a step on the side of the wiring.

A method for producing a flexible printed wiring board according to one or more embodiments is a method for producing a flexible printed wiring board using a photoresist to produce the flexible printed wiring board. The method comprising: a first step of placing the photoresist on a substrate including a first region and a second region; a second step of arranging a first photomask including a first light-transmitting portion so that the first light-transmitting portion faces the first region to expose the photoresist through the first light-transmitting portion; and a third step of arranging a second photomask including a second light-transmitting portion so that the second light-transmitting portion faces the second region to expose the photoresist through the second light-transmitting portion. The first and second regions are adjacent to each other such that an edge portion of the first region and a edge portion of the second region overlap each other, the first light-transmitting portion has a linear shape including a first tip having a tapered shape, the second light-transmitting portion has a linear shape including a second tip having a tapered shape in an opposite direction to the first tip, the third step comprises arranging the second photomask so that a second alignment target point in the second tip overlaps a first position, the first position is a position where a first alignment target point in the first tip has been positioned in the second step, the first tip comprises: a first edge portion; a first side that is connected to the first edge portion and is curved; and a second side that is connected to the first edge portion so that faces the first side and is curved, the first alignment target point is a point separated from the first edge portion by a distance A on a first center line, the first center line extends in a first longitudinal direction through a approximate center of the first light-transmitting portion, the first and second sides are located outside a first virtual triangle, the first virtual triangle is a virtual triangle formed by connecting a first intersection between the first center line and the first edge portion, a second intersection between a first virtual line and the first side, and a third intersection between the first virtual line and the second side, the first virtual line is a virtual straight line that extends along a first width direction of the first light-transmitting portion and passes through the first alignment target point, the second intersection is separated from the third intersection by a distance D, the second tip comprises: a second edge portion; a third side that is connected to the second edge portion and is curved; and a fourth side that is connected to the second edge portion so that faces the second side and is curved, the second alignment target point is a point separated from the first edge portion by a distance A on a second center line, the second center line extends in a second longitudinal direction through a approximate center of the second light-transmitting portion, the third and fourth side are located outside a second virtual triangle, the second virtual triangle is a virtual triangle formed by connecting a fourth intersection between the second center line and the second edge portion, a fifth intersection between a second virtual line and the third side, and a sixth intersection between the second virtual line and a fourth side, the second virtual line is a virtual straight line that extends along a second width direction of the second light-transmitting portion and passes through the second alignment target point, the fifth intersection is separated from the sixth intersection by a distance D, a formula (1) below is satisfied.

[Mathematical 1]

$$\Delta x < A < \Delta x + \frac{D - 2 \times \Delta y \times \cos\theta}{2 \times \sin\theta} \tag{1}$$

In the above-mentioned formula (1), $\Delta x$ is an amount of deviation of the second alignment target point from the first position in the first longitudinal direction, $\Delta y$ is an amount of deviation of the second alignment target point from the first position in the first width direction, $\theta$ is an amount of deviation of the second alignment target point from the first position in a rotational direction around a first normal line, the first normal line is a normal line that passes through the first position and is perpendicular to the first photomask.

In the above embodiments, the first light-transmitting portion may further comprise a first main line portion that connects to the first tip, the first alignment target point may be located closer to the first edge portion than a first connection portion that connects to the first main line portion in the first tip, the second light-transmitting portion may further comprise a second main line portion that connects to the second tip, the second alignment target point may be located closer to the second edge portion than a second connection portion that connects to the second main line portion in the second tip, widths of the first and second main lines may be W, a formula (2) below may be satisfied.

$$D \leq W \qquad (2)$$

In the above embodiments, the first photomask may comprise the first light-transmitting portions arranged in parallel with each other, the first tips may be sequentially shifted in the first direction so as to protrude from other adjacent first tip portion, the second photomask may comprise the second light-transmitting portions arranged in parallel with each other, the second tips may be sequentially shifted in a second direction so as to protrude from other adjacent second tip portion, the second direction may be an amount of deviation of the second alignment target point from the first position in the first width direction, the first direction may be a direction opposite to the second direction.

In the above embodiments, the second region may be adjacent the first region in the first longitudinal direction.

In the method for producing the flexible printed wiring board according to one or more embodiments, in the first and second light-transmitting portions, the first and second tips have a tapered shape, the first and second sides are curved lines located outside the first virtual triangle, the third and fourth sides are curved lines located outside the second virtual triangle, the position of the first and second alignment target point satisfies the scope of the above formula (1). Therefore, the exposed portion corresponding to the first and second edge portion do not stick out of the multiple exposed portion where the exposed portion exposed through the first light-transmitting portion and the exposed portion exposed through the second light-transmitting portion overlap each other, and thus there is no step in the outer shape of the multiple exposed portion. Therefore, since the step does not occur even in the resist pattern developed with the photoresist after exposure, it is possible to prevent the formation of the steps in the side of the wiring.

BRIEF DESCRIPTION OF THE DRAWINGS

FIG. 1 is a plan view showing an example of a flexible printed wiring board according to one or more embodiments.

FIG. 2 shows cross-sectional views showing an example of processes for producing the flexible printed wiring board according to one or more embodiments.

FIG. 3 is a plan view showing an example of a photoresist layer exposed in the exposure step shown in (b) of FIG. 2.

FIG. 5 is a plan view showing an example of a photomask used in the exposure step shown in (b) of FIG. 2.

FIG. 6 shows an enlarged plan view showing an example of a first tip of the light-transmitting portion in one or more embodiments and an enlarged plan view showing an example of a second tip of the light-transmitting portion in one or more embodiments.

DESCRIPTION OF THE EMBODIMENTS

Figure 2:
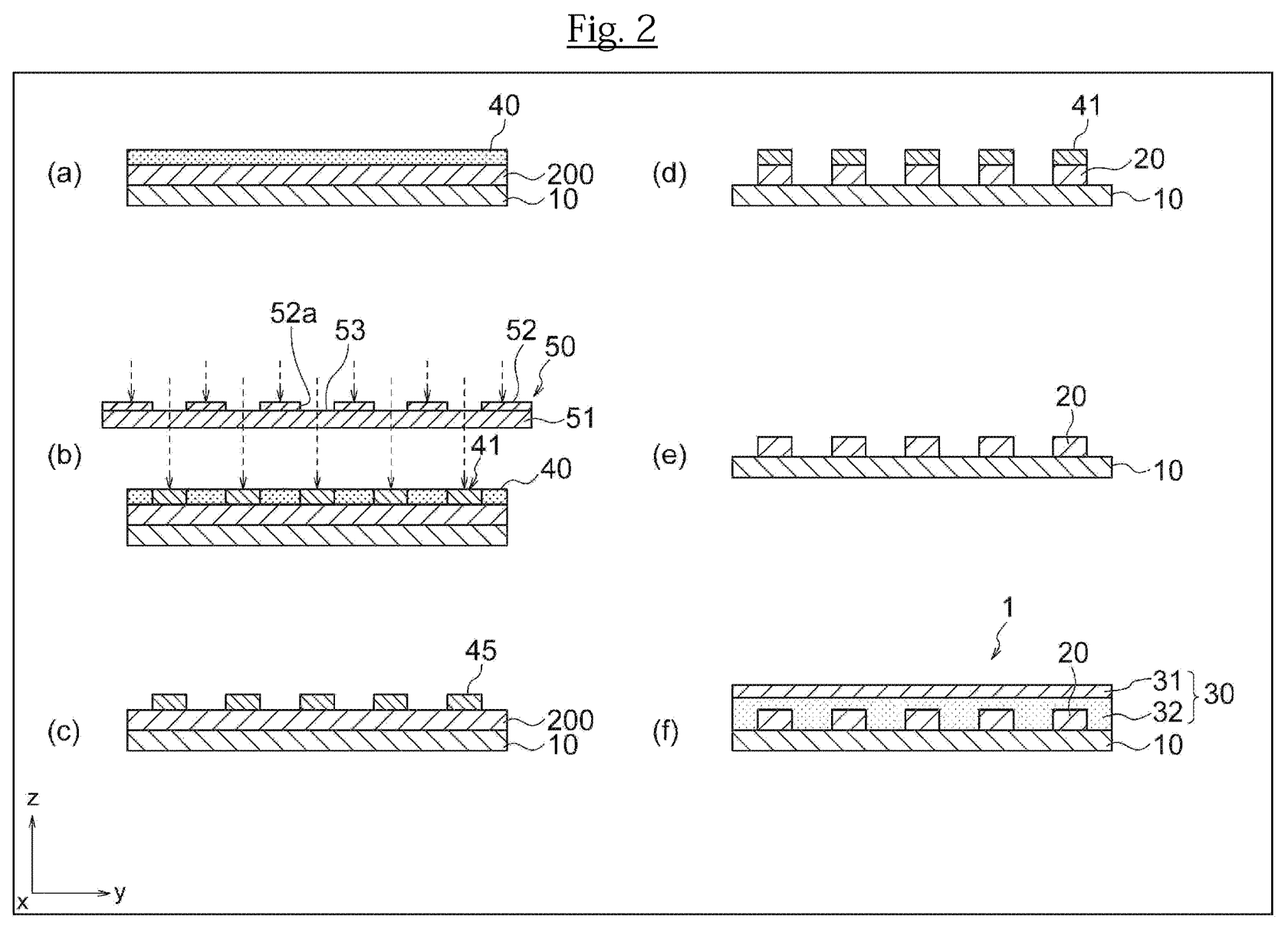
Figures 4A, 4B:
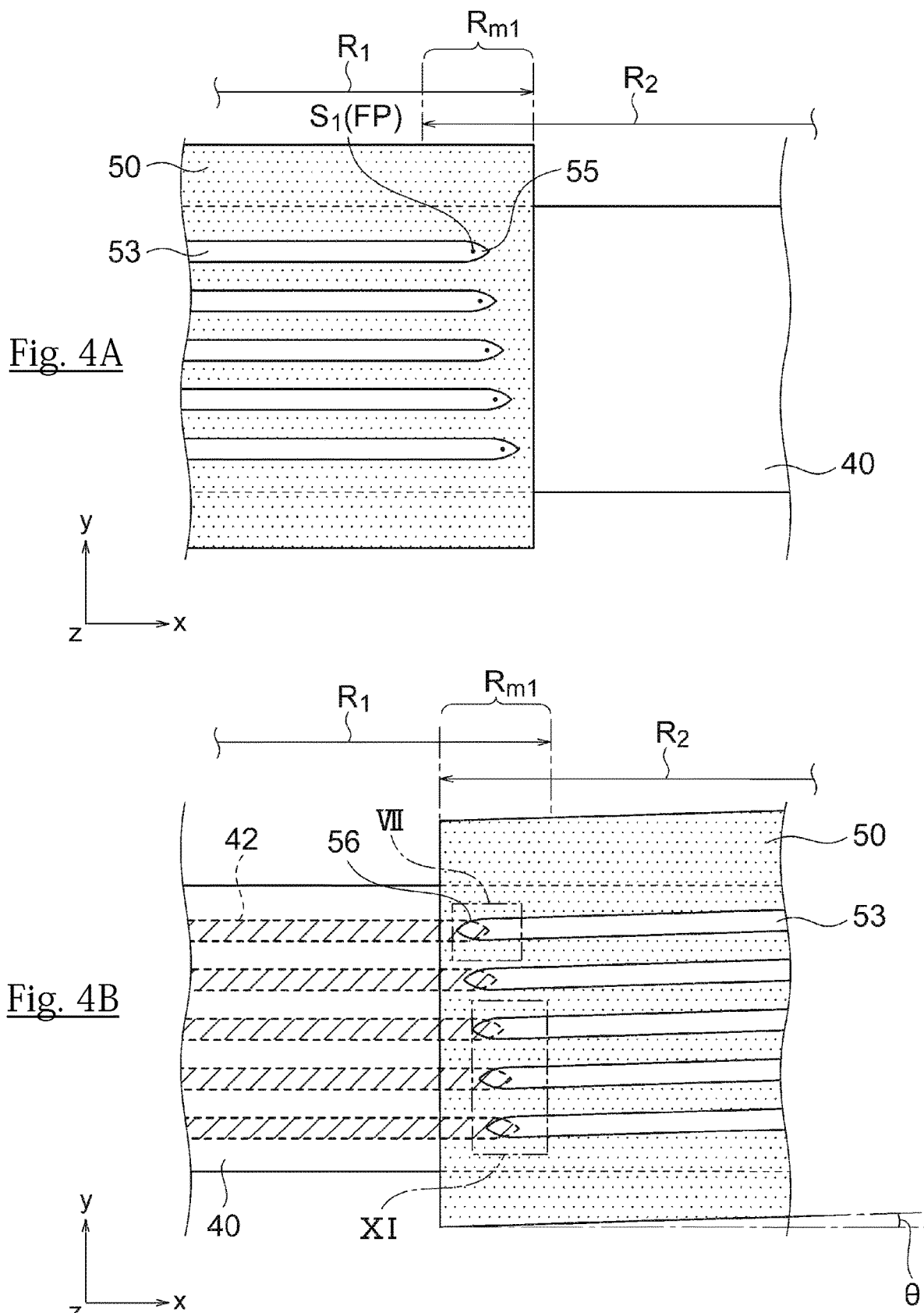
FIG. 4A is a plan view showing an example of a first exposure process in the exposure step shown in (b) of FIG. 2.
FIG. 4B is a plan view showing an example of a second exposure process in the exposure step shown in (b) of FIG. 2.

Hereinafter, embodiments will be described with reference to the drawings. FIG. 1 is a plan view showing an example of a flexible printed wiring board according to one or more embodiments. FIG. 2 shows cross-sectional views showing an example of processes for producing the flexible printed wiring board according to one or more embodiments.

As shown in FIG. 1, the flexible printed wiring board 1 in one or more embodiments is a wiring board having flexibility, and has a long strip-shaped planar shapes. The extending length of the flexible printed wiring board 1 is not particularly limited, but not less than 600 mm. This long flexible printed wiring board 1, as shown in FIGS. 1 and 2(f), for example, comprises a base film 10, wirings 20 (five in this example), and a coverlay 30.

The base film 10 is a film having a long strip shape with flexibility. The base film 10 is made of a material having an electrical insulating property such as a resin material. Although not particularly limited, examples of the material constituting the base film 10 may be polyimide (PI), liquid crystal polymer (LCP), polyethylene terephthalate (PET), polyethylene naphthalate (PEN), polyetherimide (PEI), polyetheretherketone (PEEK), and aramid.

The wirings 20 are formed on the base film 10. In one or more embodiments, the wirings 20 extend linearly along the x direction on the base film 10. The wire 20 in one or more embodiments, since it extends continuously from one edge portion of flexible printed wiring board 1 to the other edge portion, and has a long linear shape. Further, the wires 20 are arranged substantially parallel to each other at substantially equal intervals.

The number, shape, and arrangement of the wirings 20 are not particularly limited thereto, can be arbitrarily set. For example, in one or more embodiments, the wiring 20 of substantially linear shape are shown, but the wiring 20 may have a bent portion. The wirings 20 may include a via hole or the like. The wirings 20 are composed of copper. The material constituting the wiring 20 may be a metal material other than copper, for example, may be silver or gold.

Although not shown in particular, the edge portion of each of the wirings 20, pads may be formed to be connected to other flexible printed wiring board or electronic components.

The coverlay 30 is a layer for protecting the wirings 20. The coverlay 30 is formed on the base film 10 so as to cover the portion excluding the pads of the wiring 20. The coverlay 30 is composed of a film having a long strip shape with flexibility. The coverlay 30 is made of a material having an electrical insulating property such as a resin material.

The coverlay 30, as shown in (f) of FIG. 2, has a two-layer structure comprising a protective layer 31 and an adhesive layer 32. The protective layer 31 is a layer for protecting the wirings 20. The protective layer 31 is composed of a film having a long strip shape with flexibility. The protective layer 31 is made of a material having an electrical insulating property such as a resin material. Although not particularly limited, examples of the material constituting the protective layer 31 may be polyimide (PI), liquid crystal polymer (LCP), polyethylene terephthalate (PET), polyethylene naphthalate (PEN), polyetherimide (PEI), polyetheretherketone (PEEK), and aramid.

The adhesive layer 32 is a layer for bonding the protective layer 31 to the upper surface of the base film 10. The adhesive layer 32 is made of, for example, an epoxy adhesive or an acrylic adhesive.

Next, the method of producing the flexible printed wiring board 1 of one or more embodiments will be described. As shown in FIG. 2, the method for producing the flexible printed wiring board 1 according to one or more embodiments is a subtractive method which comprises forming a resist pattern by exposing and developing a photoresist formed on a metal layer, and transferring the pattern shape of the resist pattern to the metal layer by etching.

In this subtractive method, first, as shown in (a) of FIG. 2, the base film 10 comprising the metal layer 200 formed on the main surface is prepared. As the base film 10 on which the metal layer 200 is formed, for example, a copper-clad laminate (CCL: Copper Clad Laminate) or the like may be used. The length of the base film 10 in the extending direction is not particularly limited, but is equal to or more than 600 mm. The base film 10 on which the metal layer 200 is formed according to one or more embodiments corresponds to an exemplary "substrate" in one or more embodiments.

Next, as shown in (a) of FIG. 2, the photoresist layer 40 is formed on the metal layer 200 (first step). The photoresist layer 40 may be formed on the surface of the metal layer 200 in the vicinity of at least the area where the above-described wiring 20 is formed.

The photoresist layer 40 in one or more embodiments is composed of a negative photoresist. In this negative photoresist, a portion irradiated with light and exposed to light is not dissolved in a developer, while a portion not irradiated with light and not exposed to light is dissolved in a developer. Although not particularly limited, the photoresist layer 40 can be formed by applying a negative dry film resist to the metal layer 200. The step of forming the photoresist layer 40 in one or more embodiments corresponds to an example of the "first step" in one or more embodiments.

Next, as shown in (b) of FIG. 2, the photoresist layer 40 is exposed through the photomask 50. Incidentally, the photomask 50 in one or more embodiments corresponds to an example of "first photomask" and "second photomask" in one or more embodiments.

FIG. 3 is a plan view showing an example of the photoresist layer 40 exposed in the exposure step shown in (b) of FIG. 2, and FIGS. 4A and 4B is a plan view showing an example of the first and second exposure step in the exposure process shown in (b) of FIG. 2. In this exposure step, as shown in FIG. 3, the exposure pattern 41 having a shape corresponding to the wiring 20 is formed in the photoresist layer 40, since the width of the photomask 50 is smaller than the length of the wiring 20, it is necessary to implement the exposure process divided into a plurality of times.

Therefore, as shown in FIG. 4A, the first exposure process is performed by facing the photomask 50 to first region $R_1$ of the photoregist layer 40, and then, as shown in FIG. 4B, the second exposure process is performed by facing the photomask 50 to second region $R_2$ adjacent to first region $R_1$.

In addition, the edge portion of first region $R_1$ and the edge portion of second region $R_2$ are overlapped in a plane view in order to connect two or more exposure region to each other. In other words, the photoregist layer 40 has an overlapping area $R_{m1}$ in which the edge portion in the +x direction of the first region $R_1$ and the edge portion in-x direction of second region $R_2$ overlap each other. As shown in FIG. 4B, in the second exposure process, in the overlapping area $R_{m1}$, the photomask 50 is disposed to face the photoresist layer 40 so that second tip 56 overlaps at the position of the first tip 55 of the light-transmitting portion 53 in the first exposure process.

As a result, as shown in FIG. 3, the exposure pattern 41 has a first exposure portion 42 exposed by the first exposure process, a second exposure portion 43 exposed by the second exposure process, and a multiple exposure portion 44 doubly exposed by both the first and second exposure processes, and the first exposure portion 42 and the second exposure portion 43 are connected by the multiple exposure portion 44. Thus, in the exposure step of one or more embodiments, the exposure of the photoresist layer 40 is performed in a plurality of times to connect a plurality of exposure portions to each other, thereby forming the exposure pattern 41.

Note that the first exposure process in one or more embodiments corresponds to an example of "second process" in one or more embodiments, and the second exposure process in one or more embodiments corresponds to an example of "third process" in one or more embodiments.

In one or more embodiments, a case when the wiring 20 is formed by two exposure processes is exemplified, but the present invention is not limited thereto. For example, the wiring 20 may be formed by performing the exposure process three or more times. At this time, it is not necessary to expose adjacent regions along the longitudinal direction in order along the longitudinal direction, after performing intermittent exposure along the longitudinal direction, the intermittent region interposed between the exposed regions may be exposed.

Figure 6:
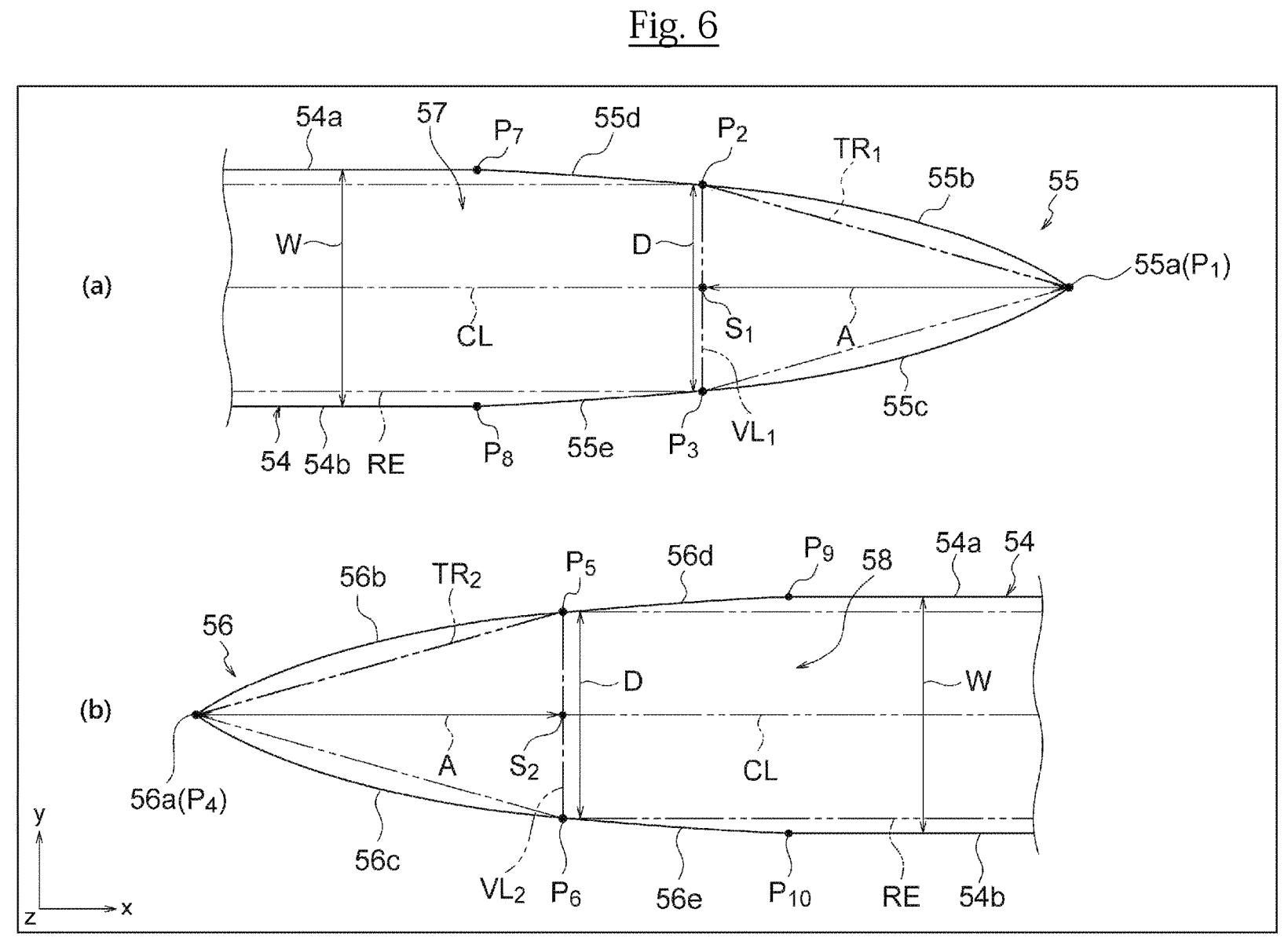

FIG. 5 is a plan view showing an example of the photomask 50 used in the exposure step shown in (b) of FIG. 2, and FIG. 6 is an enlarged plan view showing an example of the first and second tip 55, 56 of the light-transmitting portion 53 in one or more embodiments.

As shown in FIG. 5 and (b) of FIG. 2, the photomask 50 includes a transparent substrate 51, and a light shielding film 52. The transparent substrate 51 is a transparent plate-like member capable of transmitting light. This transparent substrate 51 is made of a transparent material such as glass, for example.

The light shielding film 52 is an opaque film which does not transmit light, and is formed on one main surface of the transparent substrate 51. As a material constituting the light shielding film 52, for example, a metal oxide such as chromium oxide may be used. The light shielding film 52 may be formed, for example, by depositing a metal-oxide film on the transparent substrate 51.

The light shielding film 52, as shown in FIG. 5, has five linear openings 52a, the number of these openings is same as the number of the wires 20, the transparent substrate 51 is exposed from the openings 52a. The light-transmitting portion 53 is a portion where the transparent substrate 51 is exposed by the opening 52a. The light-transmitting portion 53 of one or more embodiments corresponds to one of "first light-transmitting portion" and "second light-transmitting portion" in one or more embodiments.

The light-transmitting portion 53 has a linear planar shape identical to the planar shape of the opening 52a. Further, the light-transmitting portions 53 are arranged so as to be parallel to each other at substantially equal intervals along the width direction of the light-transmitting portion 53 (y direction in figures). Further, the light-transmitting portion 53 includes a main line portion 54, a first tip 55 disposed at one end of the main line portion 54, and a second tip 56 disposed at the other end of the main line portion 54.

The main line portion 54 is a linear portion having a substantially constant width W, and extends along the longitudinal direction of the light-transmitting portion 53 (x direction in the figure). The main line portion 54, as shown in (a) of FIG. 6, includes a linear first sideline 54a extending in the longitudinal direction of the light-transmitting portion 53, a second sideline 54b extending substantially parallel to the first sideline 54a and facing the first sideline 54a. In one or more embodiments, the first and second sidelines 54a, 54b are line-symmetrical with respect to a center line CL of the light-transmitting portion 53. Incidentally, the center line CL passes through the center in the width direction of the light-transmitting portion 53, and is a straight line extending along the longitudinal direction of the light transmitting-portion 53.

The width direction of the light-transmitting portion 53 in one or more embodiments corresponds to an example of "first width direction" and "second width direction" in one or more embodiments. Further, the longitudinal direction of the light-transmitting portion 53 in one or more embodiments corresponds to an example of "first longitudinal direction" and "second longitudinal direction" in one or more embodiments.

As shown in (a) of FIG. 6, the first tip 55 is a distal end portion having a tapered shape gradually narrowed toward the +x direction, is connected to the main line portion 54 in the first connection portion 57. The first tip 55 includes a first edge portion 55a, a first side 55b, a second side 55c, a first connection side 55d, and a second connection side 55e.

The first edge portion 55a is an edge portion located on the center line CL of the light-transmitting portion 53. In one or more embodiments, this first edge portion 55a is the point where the first and second sides 55b, 55c intersect.

The first side 55b is a convex curve toward the +y direction in the figures, intersects between the first edge portion 55a and the first connecting edge 55d, and connects the intersection $P_1$ and the intersection $P_2$. On the other hand, the second side 55c is a convex curve toward −y direction in the figures, intersects between first edge portion 55a and the second connecting edge 55e, connects the intersection $P_1$ and the intersection $P_3$. The first and second sides 55b, 55c are curved so as to approach each other as they approach first edge portion 55a, and intersect each other in first edge portion 55a. In one or more embodiments, the first and second sides 55b, 55c are line-symmetrical to each other with respect to the center line CL. The both of the first and second sides 55b, 55c are located outside a first virtual triangle $TR_1$. That is, in first tip 55, the first side 55b is located outside the first virtual triangle $TR_1$ edge $P_1P_2$, and the second side 55c is located outside the first virtual triangle $TR_1$ edge $P_1P_3$.

The intersection point $P_1$ is the intersection point between the center line CL and the first edge portion 55a. The intersection $P_2$ is the intersection of the first virtual line $VL_1$ and the first side 55b, and the intersection $P_3$ is the intersection of the first virtual line $VL_1$ and the second side 55c. Incidentally, the intersection $P_2$ is also an intersection point between the first side 55b and the first connecting line 55d, the intersection point $P_3$ is also an intersection point between the second side 55c and the second connecting line 55e. The intersection $P_1$ in one or more embodiments is an example of "first intersection" in one or more embodiments, the intersection point $P_2$ in one or more embodiments is an example of "second intersection" in one or more embodiments, and the intersection point $P_3$ in one or more embodiments is an example of "third intersection" in one or more embodiments.

The first virtual line $VL_1$ is a virtual straight line that extends along the width direction of the light-transmitting portion 53 (y direction in the figure) and passes through the first alignment target point $S_1$. The intersection $P_2$ is separated from the intersection $P_3$ by a distance D. The distance D is the above width W or less (D≤W).

The first alignment target point $S_1$ is a virtual point used for alignment of the second tip 56 in the second exposure process (see FIG. 4B). The first alignment target point $S_1$ is separated from the first edge portion 55a on the centerline CL by a distance A. The first alignment target point $S_1$ is located closer the first edge portion 55a than the first connection portion 57 in the first tip 55. In the second exposure process, the photomask 50 is aligned so that a second alignment target point $S_2$ (described later) of the second tip 56 is disposed on a first position at which the first alignment target point $S_1$ for the first position alignment was positioned in the first exposure process.

Although not particularly limited, alignment can be performed by image processing or the like using a camera. For example, the alignment marks (not shown) is formed on the base film 10 to image the base film 10 through the through holes (not shown) provided in the photomask 50. Then, it is possible to align by fixing the photomask 50 to the position where the alignment mark is captured in the imaging range through the through-hole.

As shown in (a) of FIG. 6, the first connecting side 55d is convex toward the +y direction in the figure, and is a curve line having curvature smaller than that of the first side 55b. The first connecting side 55d intersects between the first side 55b and the first sideline 54a, connects the intersection $P_2$ and the intersection $P_7$. Incidentally, the intersection $P_7$ is an intersection point between the first connecting side 55d and the first sideline 54a.

The second connecting side 55e is convex toward −y in the figures, and is a curve line having curvature smaller than the second side 55c. The second connecting side 55e intersects between the second side 55c and the second sideline 54b, connects the intersection $P_3$ and the intersection $P_8$. The third and fourth connecting sides 56d, 56e are line-symmetrically to each other with respect to the center line CL. Incidentally, the intersection $P_8$ is an intersection point between the second connecting side 55e and the second sideline 54b.

The both of the first and second connecting side 55d, 55e are located on the outside the virtual rectangular RE. As shown in FIG. 5, the virtual rectangular RE is a virtual rectangular connecting the intersection $P_2$, the intersection $P_3$, and the intersection $P_5$ (described later), and the intersection $P_6$ (described later). As shown in FIG. 5, this virtual rectangular RE intervenes between the first virtual triangle $TR_1$ and the second virtual triangle $TR_2$. That is, in the main line portion 54, the first connection side 55d is located outside the long sides $P_2P_5$ of the virtual rectangle, the second connection side 55e is located outside the rectangular sides $P_3$, $P_6$ of the virtual rectangle.

As shown in (b) of FIG. 6, the second tip 56 is a distal end having a tapered shape facing away from the first tip 55, it is connected to the main line portion 54 in the second connection portion 58. The second tip 56 includes a second edge portion 56a, a third side 56b, a fourth side 56c, a third connection side 56d, and a fourth connection side 56e.

The second edge portion 56a is an edge portion located on the center line CL of the light-transmitting portion 53. In one or more embodiments, this first edge portion 55a is the point where the first and second sides 55b, 55c intersect.

The third side 56b is a curved line obtained by reversing the left and right of the first side 55b of the first tip 55. The third side 56b is interposed between the second edge portion 56a and the third connection side 56d, then intersects the intersection $P_4$ with the intersection $P_5$. On the other hand, the fourth side 56c is a curved line obtained by reversing the left and right of the second side 55c of the first tip 55, is interposed between the second edge portion 56a and the fourth connection side 56, then connects the intersection point $P_4$ and the intersection point $P_6$. The third and fourth sides 56b, 56c are curved so as to approach each other as they approach the second edge portion 56a, and intersect each other in the second edge portion 56a. In one or more embodiments, the third and fourth sides 56b, 56c are line-symmetrical to each other with respect to the center line CL. The both of the third and fourth sides 56b, 56c are located outside second virtual triangle $TR_2$. That is, in the second tip 56, the third side 56b is located outside the sides $P_4$, $P_5$ of the second virtual triangle $TR_2$, and the fourth side 56c is located outside the sides $P_4$, $P_6$ of the second virtual triangle $TR_2$.

The second virtual triangle $TR_2$ has a shape obtained by reversing the left and right of the first virtual triangle $TR_1$. This second virtual triangle $TR_2$ is a virtual triangle connecting the intersections $P_4$ to $P_6$ in the second tip 56. The intersection $P_4$ is the intersection of the center line CL and the second edge portion 56a. The intersection $P_5$ is the intersection of the second virtual line $VL_2$ and the third side 56b, and the intersection $P_6$ is the intersection of the second virtual line $VL_2$ and fourth side 56c. The intersection $P_5$ is also an intersection point between the third side 56b and the third connection side 56d, the intersection $P_6$ is also an intersection point between fourth side 56c and the fourth connection side 56e. The intersection $P_4$ in one or more embodiments is an example of "fourth intersection" in one or more embodiments, the intersection point $P_5$ in one or more embodiments is an example of "fifth intersection" in one or more embodiments, and the intersection point $P_6$ in one or more embodiments is an example of "sixth intersection" in one or more embodiments.

The second virtual line $VL_2$ is a virtual straight line that extends along the width direction of the light-transmitting portion 53 (y direction in the figure) and passes through the first alignment target point $S_2$. The intersection $P_5$ is separated from the intersection $P_6$ by the distance D. The distance D is the above width W or less (D≤W).

In the centerline CL, the second alignment target point $S_2$ is separated from the second edge portion 56a by the distance A. The second alignment target point $S_2$ is located closer the second edge portion 56a than the second connection portion 58 in the second tip 56.

As shown in (b) of FIG. 6, the third connection side 56d is a curved line obtained by reversing the left and right of the first connection side 55d. The third connection side 56d is interposed between the third side 55b and the first sideline 54a, connects the intersection $P_5$ and the intersection $P_9$. Incidentally, the intersection $P_9$ is an intersection point between the third connection side 56d and the first sideline 54a.

The fourth connection side 56e is a curved line obtained by reversing the left and right of the second connection side 55e. The fourth connection side 56e is interposed between the fourth side 56c and the second sideline 54b, connects the intersection $P_3$ and the intersection $P_{10}$. The third and fourth connection sides 56d, 56e are line-symmetrically to each other with respect to the center line CL. Incidentally, the intersection $P_{10}$ is the intersection of the fourth connection side 56e and the second sideline 54b. The both of the third and fourth connection sides 56d, 56e are located outside the virtual rectangular RE. That is, in the main line portion 54, the third connection side 56d is located outside the long sides $P_2$, $P_5$ of the virtual rectangle, the fourth connection side 56e is located outside the rectangular sides $P_3$, $P_6$ of the virtual rectangle.

Figure 7:
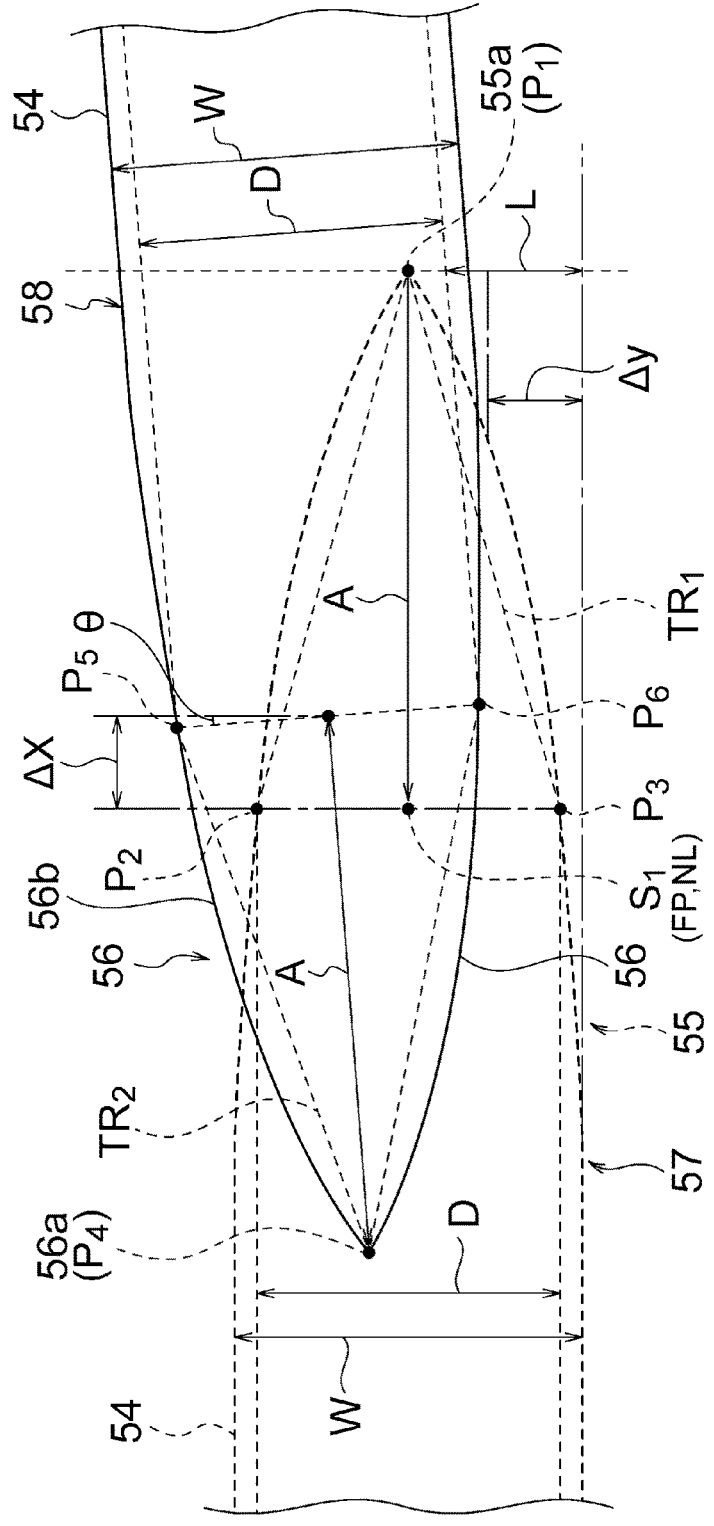
FIG. 7 is a plan view showing a positional relation between the first tip at the time of the first exposure process and the second tip at the time of the second exposure process.

FIG. 7 is an enlarged plan view showing the positional relation between the first tip 55 at the time of the first exposure process and the second tip 56 at the time of the second exposure process. FIG. 7 corresponds to an enlarged plan view of VII part of FIG. 4B. As described above, in the second exposure process, the second tip 56 is overlapped with the first tip 55 in the first exposure process. At this time, the photomask 50 is aligned so that the second alignment target point $S_2$ is positioned on the first position FP where the first alignment target point $S_1$ was positioned in the first exposure process.

However, since it is difficult to exactly match the second alignment target point $S_2$ to the first position FP, a deviation ($\Delta x$, $\Delta y$, or $\theta$) is occurred. Here, $\Delta x$ is an amount of deviation of the second alignment target point $S_2$ with respect to the first position FP in the longitudinal direction of the light-transmitting portion 53 (x direction). $\Delta y$ is an amount of deviation of the second alignment target point $S_2$ with respect to the first position FP in the width direction of the light-transmitting portion 53 (y direction). $\theta$ is an amount of deviation of the second alignment target point $S_2$ relative to the first position FP in the rotational direction around a first normal line NL. The first normal NL is a straight line that extends through the first position FP and in a direction (z direction in the drawing) perpendicular to the main surface of the photomask 50. The value of $\theta$ is an angle formed between the light-transmitting portion 53 during the first exposure process and the light-transmitting portion 53 during the second exposure process, and is equal to, for example, the angle formed between the center line CL during the first exposure process and the center line CL during the second exposure process.

When the deviation ($\Delta x$, $\Delta y$, $\theta$) occurs, the first edge portion at the time of the first exposure process may be sticked out of the second tip and the main line portion at the time of the second exposure process, or the second edge portion at the time of the second exposure process may be sticked out of the first tip and the main line portion at the time of the first exposure process, as a result, the steps or the protrusions occurred in the wiring.

In contrast, in one or more embodiments, assuming the occurrence of the deviation ($\Delta x$, $\Delta y$, $\theta$), the positions of the first and second alignment target points $S_1$, $S_2$ are set to satisfy the following equation (3) to prevent overhang of the first and second edges.

[Mathematical 2]

$$\Delta x < A < \Delta x + \frac{D - 2 \times \Delta y \times \cos \theta}{2 \times \sin \theta} \qquad (3)$$

Figure 8:
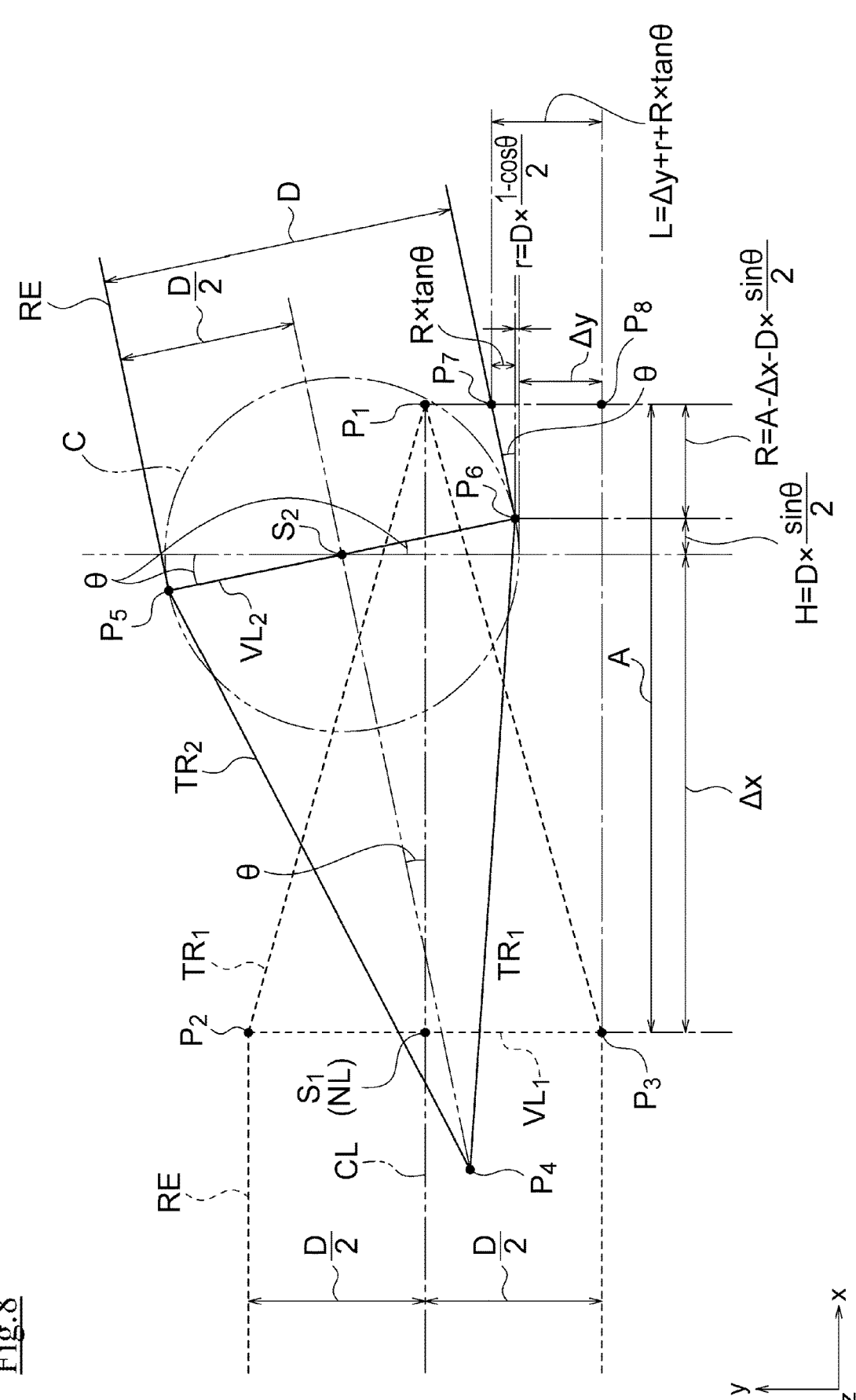
FIG. 8 is an explanatory view showing the formula (3) in one or more embodiments.

FIG. 8 is an explanatory diagram showing the above equation (3) in one or more embodiments. In FIG. 8, the first virtual triangle $TR_1$ and the right end of the virtual rectangle during the first exposure process are indicated by a dashed line, and the second virtual triangle $TR_2$ and the left end of the virtual rectangle during the second exposure process are indicated by a solid line.

Further, in FIG. 8, the case that the value of the deviation ($\Delta x$, $\Delta y$, $\theta$) is a positive value is exemplified. Here, when the center line CL during the first exposure process is the x-axis and first the virtual line $VL_1$ is the y-axis and the first alignment target point $S_1$ is the origin, $\Delta x$ is positive if the second alignment target point $S_2$ is positioned to the right side (+x-direction) of the y-axis, $\Delta x$ is negative if the second alignment target point $S_2$ is positioned to the left side (−x side) of the y-axis. Similarly, the reference numerals of $\Delta y$ and $\theta$ are positive if the second alignment target point $S_2$ is located above the x-axis (+y direction side), and are negative if the second alignment target point $S_2$ is located below the x-axis (−y direction side).

In FIG. 8, in order to prevent the protrusion of the first edge portion 55a, it is sufficient that the first edge portion 55a (intersection $P_1$) is located inside the virtual rectangular RE. That is, as in the equation (4) below, the length L in FIG. 8 may be less than D/2. The length L is a distance from the intersection $P_7$ to the intersection $P_8$. The intersection point $P_7$ is the intersection point between the perpendicular line extending along −y direction from the intersection point $P_1$ and the virtual rectangular RE in the second exposure process, and the intersection point $P_8$ is the intersection point between the perpendicular line and the extension line of the lower side of the virtual rectangular RE in the first exposure process. As shown in FIG. 8, the value of L can be expressed as shown in the following formula (5).

[Mathematical 3]

$$L < \frac{D}{2} \qquad (4)$$

Figure 9:
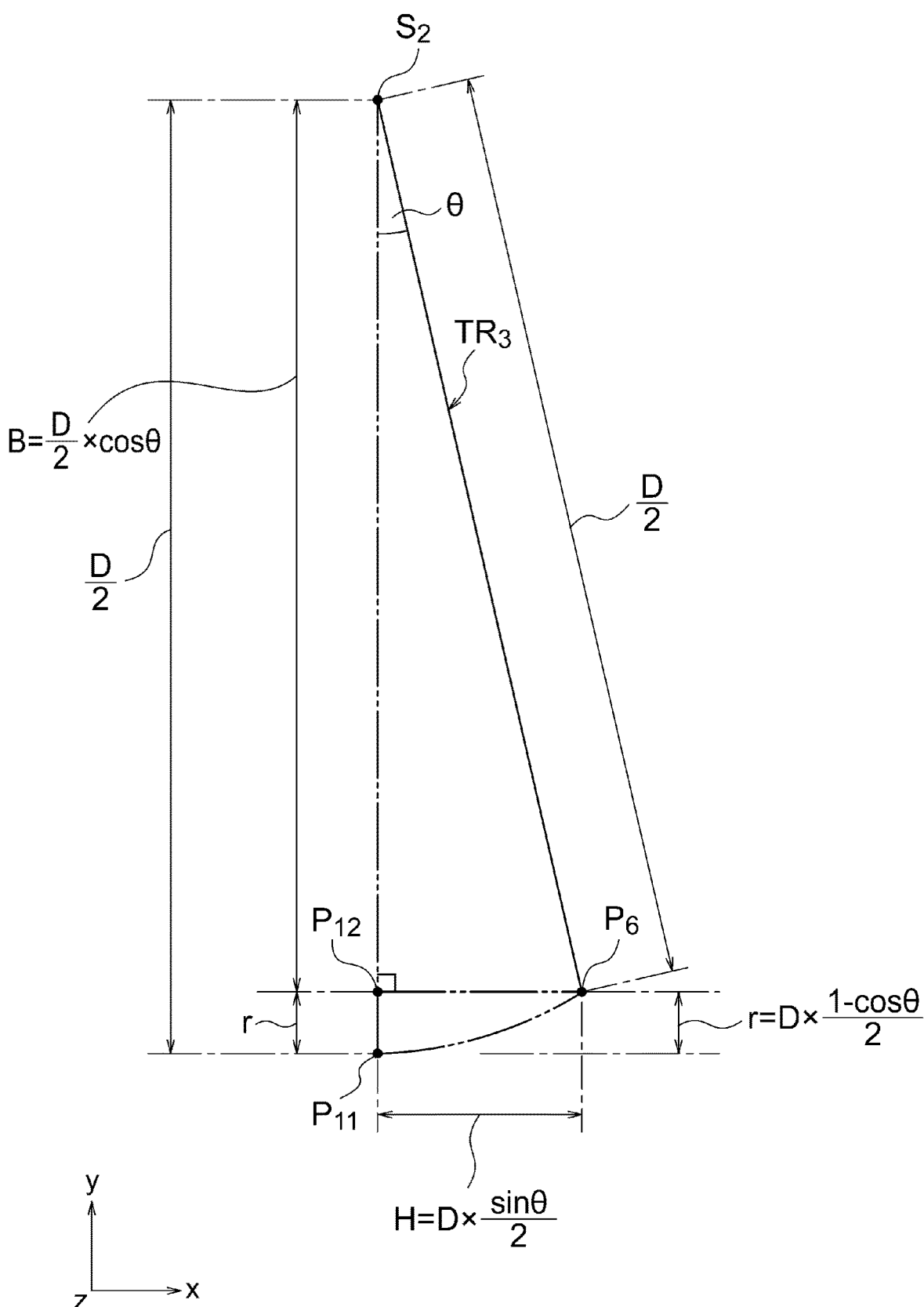
FIG. 9 is an explanatory view showing the formula (6) in one or more embodiments.

[Mathematical 4]

$$L = \Delta y + r + R \times \tan \theta \qquad (5)$$

r in the above formula (5) can be expressed as the following formula (6). FIG. 9 is an explanatory diagram showing the formula (6) in one or more embodiments. The intersection $P_{11}$ in FIG. 9 is the intersection point between the straight line extending along −y direction from the second alignment target point $S_2$ and an arc of a virtual circle C. Incidentally, the center of the virtual circle C is the second alignment target point $S_2$, as shown in FIG. 8, the radius is D/2. Further, a center angle of the arc of the virtual circle C is $\theta$. Further, the intersection $P_{12}$, as shown in FIG. 9, is an intersection point between a straight line extending along-x direction from the intersection point $P_6$ described above, and a perpendicular line connecting the second alignment target point $S_2$ and the intersection point.

[Mathematical 5]

$$r = D \times \frac{1 - \cos \theta}{2} \qquad (6)$$

As shown in FIG. 9, r can be calculated by subtracting the length B of the side $S_2$, $P_{12}$ of the virtual right-angle triangular $TR_3$ from the radius D/2 (r=D/2−B). The right-angle triangle $TR_3$ is a virtual right-angle triangle connecting the points $P_6$, $P_{12}$, $S_2$. $\angle P_6 P_{12} S_2$ of this right-angle triangle $TR_3$ is 90° ($\angle P_6 P_{12} S_2$=90°) and $\angle P_6 S_2 P_{12}$ is $\theta$° ($\angle P_6 S_2 P_{12}$=0°). Therefore, the length B of the side $S_2 P_{12}$ is D/2*cos $\theta$ (B=D/2*cos $\theta$), r can be expressed as the formula (6).

Further, R in the above formula (5) can be expressed as the following formula (7). That is, as shown in FIG. 8, R can be calculated by subtracting $\Delta x$ and H from A. Here, as shown in FIG. 9, H is D/2*sin $\theta$ (H=D/2*sin $\theta$) because H is the length of the side $P_6 P_{12}$ of the right-angle triangle $TR_3$. Therefore, R can be expressed as the following formula (7).

[Mathematical 6]

$$R = A - \Delta x - D \times \frac{\sin \theta}{2} \qquad (7)$$

When the above formulas (5) to (7) thus obtained are substituted into the above formula (4), the following formula (8) can be obtained. This formula (8) is the right-hand side of the above formula (3). That is, the distance A between the first alignment target point $S_1$ and the first edge portion 55a satisfies the formula (8) below to prevent the first edge portion 55a from being sticked out of the second virtual triangle $TR_2$. Also, since the second virtual triangle $TR_2$ has the shape reversing the left and right of the first virtual triangle $TR_1$, the distance A between the second alignment target point $S_2$ and the second edge portion 56a satisfy the formula (8) below to prevent the second edge portion 56a from being sticked out of the first virtual triangle $TR_1$.

[Mathematical 7]

$$A < \Delta x + \frac{D - 2 \times \Delta y \times \cos \theta}{2 \sin \theta} \qquad (8)$$

The first and second sides 55b, 55c are located outside the first virtual triangle $TR_1$, and the third and fourth sides 56b, 56c are located outside the second virtual triangle $TR_2$. For this reason, first edge portion 55a is located between the third and fourth side 56b, 56c, and second edge portion 56a is located between the first and second sides 55b, 55c, so the first and second edge portions 55a, 56a are not sticked out of the second and first tips 56, 55. Therefore, the position of the first and second alignment target points $S_1$, $S_2$ satisfy the above formula (8), the step or protrusion on the side surface of the wiring 20 does not occur.

Figure 10:
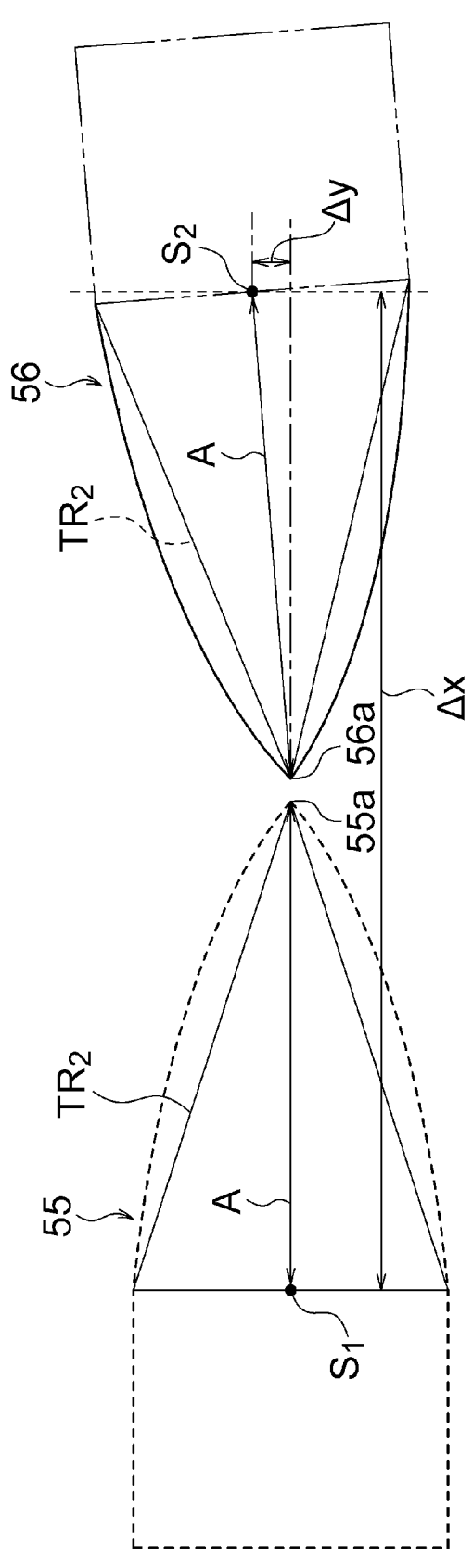
FIG. 10 is a plan view showing a comparative example when the first tip and the second tip do not overlap.

FIG. 10 is a plan view showing a comparative example in which the first tip and the second tip do not overlap. As shown in FIG. 10, when the value of Δx is larger than the total distance 2A of the distance A from first alignment target point S₁ to the first edge portion 55a and the distance A from the second alignment target point S₂ to the second edge portion 56a (Δx>2A), the multiple exposure portion is not formed, and the wiring becomes discontinuous. Thus, the distance A must be at least greater than Δx/2 (Δx/2<A). Furthermore, considering the variation in the finish of the circuit width in the etching process of the metal layer 200 as a subsequent step, there is a possibility that the wiring becomes discontinuous when the distance A is a value around Δx/2, as in the following equation (9), the value of the distance A needs to be greater than that of Δx. This formula (9) is the left side of the-above formula (3). Therefore, since the position of the first and second alignment target points S₁, S₂ satisfy the following formula (9), the disconnection in the wiring 20 does not occur.

[Mathematical 8]

$$\Delta x < A \tag{9}$$

The values of Δx, Δy, and θ are not particularly limited, and are values according to the type of the exposure apparatus, the accuracy of the positioning apparatus, or the like, and are values obtained in advance in the test exposure or the like. By way of example, Δx may be −50 μm to +50 μm (−50 μm≤Δx≤+50 μm), Δy may be −50 μm to +50 μm (−50 μm≤Δy≤+50 μm), and θ may be −1° to +1° (−1°≤θ≤+1°).

Further, as shown in FIGS. 4A and 4B, in the width direction (y direction in the figures), the light-transmitting portions 53 are sequentially shifted to protrude with respect to the other light transmitting portion 53 adjacent to the light-transmitting portions 53 toward the longitudinal direction (x-direction in the figure). Therefore, the first tips 55 are sequentially displaced so as to protrude with respect to the other first tip 55 adjacent toward −y direction in the figures, the second tips 56 are sequentially displaced so as to protrude with respect to the other second tip 56 adjacent toward the +y direction in the figure.

In the second exposure process, when the light-transmitting portion 53 shifts in the y direction due to the influence of Δy and θ, the distance (pitch) between the exposure patterns becomes narrow in the multiple exposure portion, and a portion where the distance (pitch) between the wirings becomes narrow is formed. In contrast, as shown in one or more embodiments, since the plurality of light transmitting portions 53 are sequentially shifted toward the longitudinal direction, it is possible to restrain the distance between the exposure pattern 41 (pitch) is narrowed, the distance between the wires 20 (pitch) is narrowed it can be suppressed.

Figure 11:
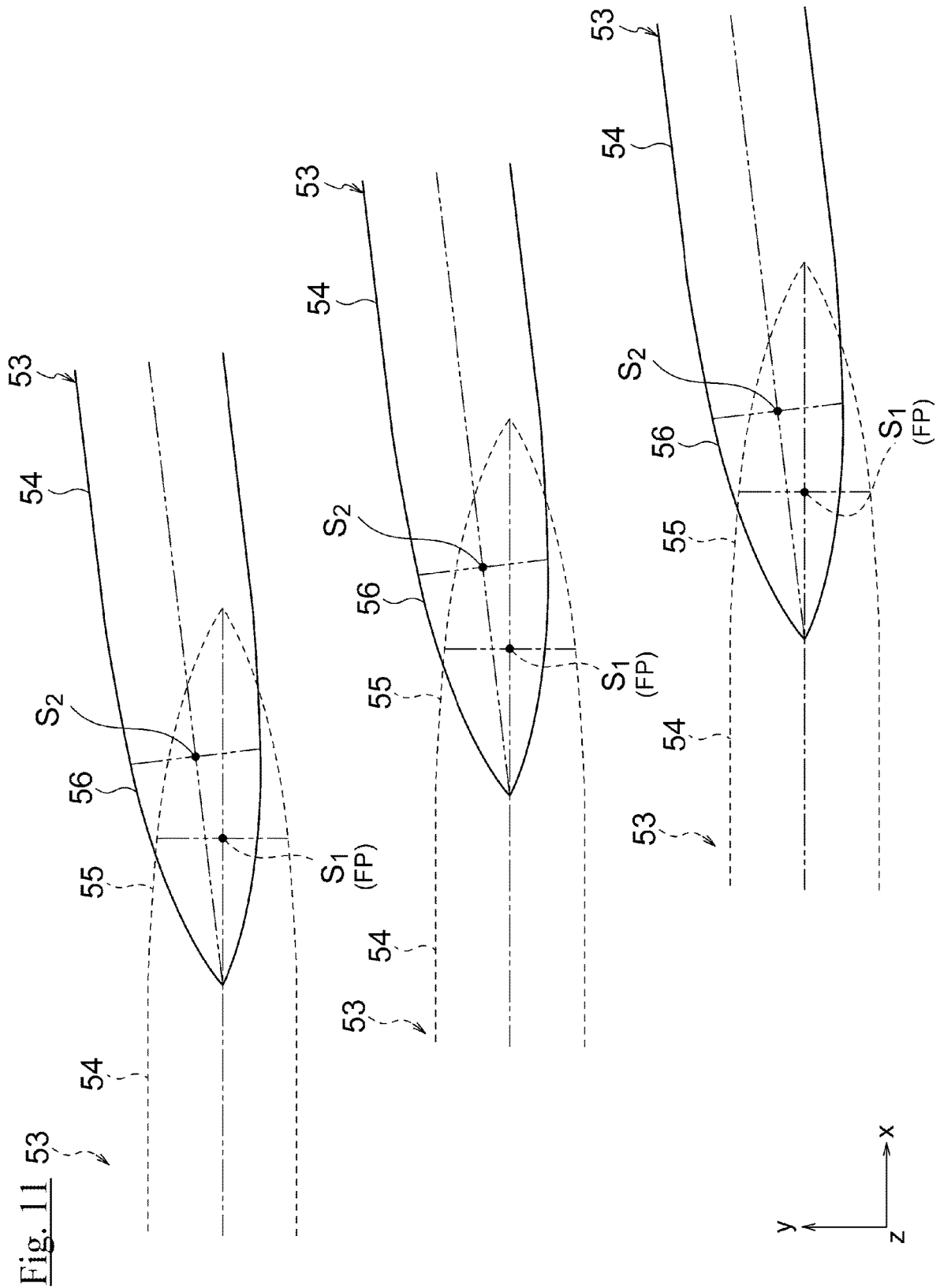
FIG. 11 is an enlarged plan view of XI portion of FIGS. 4A and 4B.

FIG. 11 is an enlarged plan view of XI portion of FIG. 5. In this FIG. 11, as an example, a case when the direction of the deviation Δy along the width direction of the light-transmitting portion 53 in the second exposure process is the +y direction is shown. In this case, −y direction in one or more embodiments corresponds to an example of "first direction" in one or more embodiments, and +y direction in one or more embodiments corresponds to an example of "second direction" in one or more embodiments.

In this instance, the first tip 55 is sequentially displaced so as to protrude with respect to the other adjacent first tip 55 toward −y direction opposite to the +y direction, and the second tip 56 is sequentially displaced so as to protrude with respect to the other adjacent second tip 56 toward the +y direction. Therefore, the first tip 55, in an overlapping portion of the first tip 55 and the second tip 56, the pitch between the light-transmitting portions 53 is not narrowed. Therefore, it is possible to restrain that the pitch between the wirings 20 is narrowed.

Although not shown in particular, when the direction of the deviation along the y direction of the light-transmitting portion 53 in the second exposure process is −y direction, the first tip 55 is sequentially shifted so as to protrude with respect to the other first tip 55 adjacent toward the +y direction, the second tip 56 is sequentially shifted so as to protrude with respect to the other second tip 55 adjacent toward the −y direction, thereby it is possible to restrain that the pitch between the wirings 20 is narrowed as described above.

After the exposure step is completed, a developing step is performed as shown in (c) of FIG. 2. In this development step, a non-photosensitive portion of the photoresist layer 40 is dissolved by a developer. Thus, the resist pattern 45 having substantially the same shape as the exposure pattern 41 (see FIG. 3) is formed on the upper surface of the metal layer 200. The resist pattern 45 functions as an etching mask in the next step.

As the developer, for example, alkaline solutions such as tetramethylammonium hydroxide (TMAH), tetraethylammonium hydroxide (TEAH), tetrapropylammonium hydroxide (TPAH), and tetrabutylammonium hydroxide (TBAH) may be used.

Next, as shown in (d) of FIG. 2, an etching step is performed. In this etching step, the portion exposed from the resist pattern 45 is removed by etching. Thus, the shape of the resist pattern 45 is transferred to the metal layer 200, and the wiring 20 is formed.

The method of performing the etching is not particularly limited, it is possible to use a spray etching method for performing etching by spraying an etching solution to the metal foil from the spray nozzle (not shown). Further, as the etching solution, for example, an aqueous solution of ferric chloride, an aqueous solution of cupric chloride, or the like can be used. As a method of performing etching is not limited to spray etching method only, for example, it may be used a dip etching method or the like for dipping a metal foil in the etching solution. Further, rather than the wet etching method, it may be used a dry etching method using an etching gas.

Next, as shown in (e) of FIG. 2, a peeling step of the resist pattern 45 is performed. The resist pattern 45 can be peeled off by a stripping solution. Thus, the wiring 20 is exposed. As the stripping solution, for example, an aqueous alkali solution such as sodium hydroxide can be used.

Next, as shown in (f) of FIG. 2, the cover lay forming step of forming the cover lay 30. The coverlay 30 can be formed by attaching the adhesive layer 32 of the coverlay 30 as described above from the wiring 20 side to the base film 10.

The method of forming the coverlay 30 is not particularly limited to the above. For example, the coverlay 30 may be formed using a dry film made of a photosensitive coverlay material instead of the above-described resin film, or the coverlay 30 may be formed by exposing and developing a liquid photosensitive coverlay material after it is applied onto the base film 10. Alternatively, the coverlay cover in liquid form may be printed onto the base film 10 to form the coverlay 30.

Alternatively, the coverlay 30 may be constituted by a so-called solder resist. Specifically, a dry film made of a photosensitive resist material may be used to form the coverlay 30 Alternatively, the coverlay 30 may be formed by exposing and developing a liquid photosensitive resist material onto the base film 10. Alternatively, the coverlay 30 may be formed by printing a liquid solder resist ink onto the base film 10.

Specific examples of the photosensitive coverlay material and the photosensitive resist material described above include those using, for example, polyester, epoxy, acrylic, polyimide, polyurethane, and the like. Further, as specific examples of the cover lay ink and the solder resist ink described above, those based on polyimide or epoxy can be exemplified.

As described above, it is possible to produce flexible printed wiring board 1. In the method for producing the flexible printed wiring board 1 in one or more embodiments, in the light-transmitting portion 53, the first and second tips 55 and 56 have a tapered shape, the first and second sides 55b, 55c are curve lines located outside the first virtual triangle TR$_1$, the third and fourth sides 56b, 56c are curve lines located outside the second virtual triangle TR$_1$, the position of the first and second alignment target points S$_1$, S$_2$ satisfy the scope of the above formula (3). Therefore, since the exposed portions corresponding to the first and second edge portions 55a, 56a are not sticked out of the multiple exposure portion 44, there is no step in the outer shape of the multiple exposure portion 44.

Further, since the first to fourth sides 55b, 55c, 56b, 56c are the curved lines, there is no step at the intersection portion of these sides of the multiple exposure portion 44.

From the above, since there is no step in the resist pattern 45 developed with the photoresist 40 after exposure, it is possible to prevent a step on the side surface of the wiring.

Since the first and second tips 55, 56 have a tapered shape, the width of the multiple exposure portion 44 is not too thick. Therefore, since a portion with excessively thick widths in the resist pattern 45 is hardly formed, a portion that is excessively thick in the wiring 20 are less likely to occur.

Further, in the conventional manufacturing method, since the multiple exposure portion is exposed twice through the first and second tips having the same width, overexposure may occur in the multiple exposure portion, and consequently, the width of the portion corresponding to the multiple exposure portion may become thicker in the wiring.

In contrast, in one or more embodiments, in the first tip 55 having the tapered shape, the first alignment target point S$_1$ is located closer the first edge portion 55a than the first connection portion 57, in the second tip 56 in the tapered shape facing away from the first tip 55, the second alignment target point S$_2$ is located closer the second edge portion 56a than the second connection portion 58. That is, in the first tip 55, the tapering begins on the first connection portion 57 side rather than the first alignment target point S$_1$, and in the second tip 56, the tapering begins on the second connection portion 58 side rather than the second alignment target point S$_2$.

Therefore, in the multiple exposure section 44, the relatively thick portion of the first tip 55 and the relatively thin portion of the second tip 56 overlap each other, and conversely, the relatively thin portion of the first tip 55 and the relatively thick portion of the second tip 56 overlap each other. Therefore, the exposure amount in the multiple exposure section 44 can be made uniform. Therefore, the width of the wiring 20 of the portion corresponding to the multiple exposure portion 44 is not excessively thick.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

For example, in the above-described exposure step, an example when the exposure processes are performed using the same photomask 50 in the first and second exposure processes, but the present invention is not limited thereto. The first photomask used in the first exposure process and the second photomask used in the second exposure process may be different types of photomasks. Even in this case, a photomask in which the light-transmitting portion having the first and second tip satisfying the above equation (3) is formed is used.

Further, in the above embodiments, the first to fourth sides 55b, 55c, 56b, 56c are the curved lines having only one convex portion projecting in one direction, but not limited thereto. The first to fourth sides 55b, 55c, 56b, 56c may be curved lines of any shape as long as they are located outside the first and second virtual triangles TR$_1$, TR$_2$, and for example, may be curved lines having the convex portions described above. Similarly for the first to fourth connection sides 55d, 55e, 56d, 56e, they may be the curved lines having a plurality of convex portions.

In the above-described embodiments, the producing method using the subtractive method has been exemplified, but flexible printed wiring board may be produced by a so-called semi-additive process. In this semi-additive method, the photoresist layer 40 composed of a positive resist in which a photosensitive portion is dissolved in a developer is formed on a base film 10. Then, after a plurality of times exposure processing is performed by the photomask 50 as described above, the resist pattern is developed. In this case, the photoresist layer is removed along the shape of the exposure pattern. Then, the wirings 20 are formed on the main surface of the base film 10 exposed by the photoresist layer is removed by plating or the like.

Further, the first and second alignment target points S$_1$, S$_2$ of the above-described embodiments is located on the center line CL, but is not limited thereto. If the distance D is sufficiently larger than the deviation Δy of the light-transmitting portion 53 during the second exposure process, the first and second alignment target points S$_1$, S$_2$ may be slightly shifted from the center line CL in the y direction. However, to prevent the first and second edge portions 55a, 56a from being sticked out, the first and second alignment target points S$_1$, S$_2$ are set so that the sum of the distance along the y direction from the center line CL to the first and second alignment target points S$_1$, S$_2$ and the deviation Δy is D/2 or less.

Further, the first and second alignment target points S$_1$, S$_2$ according to the above-described embodiments are arranged at a substantially center in the longitudinal direction of the first and second tips 55, 56, but are not limited thereto. In longitudinal direction, the first and second alignment target points S$_1$, S$_2$ may be positioned closer the first and second edge portion 55a, 56a than the center, or closer the first and second connection portions 57, 58 than the center.

In the above embodiments, the first and second edge portions 55a, 56a are not limited to this, they are straight lines or curved lines with the length of D or less in the width direction (y direction in the figures).

EXPLANATIONS OF LETTERS OR NUMERALS

1 . . . Flexible printed wiring board
10 . . . Base film
20 . . . Wiring
30 . . . Cover lay
31 . . . Protection layer
32 . . . Adhesive layer
40 . . . Photoresist layer
41 . . . Exposure pattern
42 . . . First exposure portion
43 . . . Second exposure portion
44 . . . Multiple exposure portion
45 . . . Resist pattern
50 . . . Photomask
51 . . . Transparent substrate
52 . . . Light shielding film
53 . . . Light transmitting portion
54 . . . Main line portion
54*a*, 54*b* . . . First and second sidelines
55 . . . First tip
55*a* . . . First edge portion
55*b*, 55*c* . . . First and second sides
55*d*, 55*e* . . . First and second connection sides
56 . . . Second tip
56*a* . . . Second edge portion
56*b*, 56*c* . . . Third and fourth sides
56*d*, 56*e* . . . Third and fourth connection sides
57, 58 . . . First and second connection portion
$S_1$, $S_2$ . . . First and second alignment target point
$R_1$, $R_2$ . . . First and second region
$R_{m1}$ . . . Overlapping Region
$TR_1$, $TR_2$ . . . First and second virtual triangle
RE . . . Virtual rectangle

The invention claimed is:

1. A method for producing a flexible printed wiring board using a photoresist, comprising:

placing the photoresist, including a first region and a second region, on a substrate;

placing a first photomask including a first light-transmitting portion such that the first light-transmitting portion faces the first region to expose the photoresist through the first light-transmitting portion; and placing a second photomask including a second light-transmitting portion such that the second light-transmitting portion faces the second region to expose the photoresist through the second light-transmitting portion, wherein the first region is adjacent to the second region such that an edge portion of the first region overlaps an edge portion of the second region, the first light-transmitting portion has a linear shape including a first tip having a tapered shape, the first tip comprises:

a first edge portion;

a first curved side connected to the first edge portion; and a second curved side connected to the first edge portion and facing the first curved side, the second light-transmitting portion has a linear shape including a second tip having a tapered shape in an opposite direction to the first tip, the second tip comprises:

a second edge portion;

a third curved side connected to the second edge portion; and a fourth curved side connected to the second edge portion and facing the third curved side, the placing of the first photomask comprises placing a first alignment target point in the first tip at a first position, the placing of the second photomask comprises placing the second photomask such that a second alignment target point in the second tip overlaps the first position, the first alignment target point is separated from the first edge portion by a first distance on a first center line extending in a first longitudinal direction through a center of the first light-transmitting portion, the first and second curved sides are outside a first virtual triangle, the first virtual triangle is formed by connecting a first intersection between the first center line and the first edge portion, a second intersection between a first virtual line and the first curved side, and a third intersection between the first virtual line and the second curved side, the first virtual line extends along a first width direction of the first light-transmitting portion and passes through the first alignment target point, the second intersection is separated from the third intersection by a second distance, the second alignment target point is separated from the second edge portion by the first distance on a second center line extending in a second longitudinal direction through a center of the second light-transmitting portion, the third and fourth curved sides are outside a second virtual triangle, the second virtual triangle is formed by connecting a fourth intersection between the second center line and the second edge portion, a fifth intersection between a second virtual line and the third curved side, and a sixth intersection between the second virtual line and the fourth curved side, the second virtual line extends along a second width direction of the second light-transmitting portion and passes through the second alignment target point, the fifth intersection is separated from the sixth intersection by the second distance, and $$\Delta x < A < \Delta x + \frac{D - 2 \times \Delta y \times \cos \theta}{2 \times \sin \theta}$$

is satisfied
where $\Delta x$ is an amount of deviation of the second alignment target point from the first position in the first longitudinal direction, $\Delta y$ is an amount of deviation of the second alignment target point from the first position in the first width direction, $\theta$ is an amount of deviation of the second alignment target point from the first position in a rotational direction around a first normal line passing through the first position and perpendicular to the first photomask, A is the first distance, and D is the second distance.

2. The method according to claim 1, wherein
the first light-transmitting portion comprises a first main line portion connected to the first tip,

the first alignment target point is closer to the first edge portion than a first connection portion connected to the first main line portion in the first tip, the second light-transmitting portion comprises a second main line portion connected to the second tip, the second alignment target point is closer to the second edge portion than a second connection portion connected to the second main line portion in the second tip, and D≤W is satisfied where W is a width of the first main line and a width of the second main line.

3. The method according to claim 1, wherein the first photomask further includes at least one additional first light-transmitting portion arranged in parallel with the first light-transmitting portion, the first tip and at least one additional first tip of the at least one additional first light-transmitting portion are sequentially shifted in a first direction to protrude from adjacent first tip, the second photomask further includes at least one additional second light-transmitting portion arranged in parallel with the second light-transmitting portion, the second tip and at least one additional second tip of the at least one additional second light-transmitting portion are sequentially shifted in a second direction to protrude from adjacent second tip, the second direction is a direction of the $\Delta y$, and the first direction is opposite to the second direction.

4. The method according to claim 2, wherein the first photomask further includes at least one additional first light-transmitting portion arranged in parallel with the first light-transmitting portion, the first tip and at least one additional first tip of the at least one additional first light-transmitting portion are sequentially shifted in a first direction to protrude from adjacent first tip, the second photomask further includes at least one additional second light-transmitting portion arranged in parallel with the second light-transmitting portion, the second tip and at least one additional second tip of the at least one additional second light-transmitting portion are sequentially shifted in a second direction to protrude from adjacent second tip, the second direction is a direction of the $\Delta y$, and the first direction is opposite to the second direction.

* * * * *